(12) United States Patent
Griffioen

(10) Patent No.: US 7,112,777 B2
(45) Date of Patent: Sep. 26, 2006

(54) METHOD AND APPARATUS FOR PROTECTING OPTICAL RECEIVERS FROM OVERLOAD OPTICAL SIGNALS

(75) Inventor: Robert Griffioen, Nepean (CA)

(73) Assignee: Nortel Networks Limited, St. Laurent (CA)

( * ) Notice: Subject to any disclaimer, the term of this patent is extended or adjusted under 35 U.S.C. 154(b) by 292 days.

(21) Appl. No.: 10/803,916

(22) Filed: Mar. 19, 2004

(65) Prior Publication Data

US 2005/0205760 A1   Sep. 22, 2005

(51) Int. Cl.
*H03G 3/20* (2006.01)

(52) U.S. Cl. ............................ 250/214 AG; 250/214 A

(58) Field of Classification Search ......... 250/214 AG, 250/214 A; 398/136, 137, 206, 213
See application file for complete search history.

(56) References Cited

U.S. PATENT DOCUMENTS

| | | | |
|---|---|---|---|
| 4,623,786 A | 11/1986 | Rodwell | 250/214 |
| 5,929,982 A * | 7/1999 | Anderson | 250/214 AG |
| 6,313,459 B1 * | 11/2001 | Hoffe et al. | 250/214 AG |
| 6,852,966 B1 * | 2/2005 | Douma et al. | 250/214 AG |

OTHER PUBLICATIONS

Quantum Devices, Inc. "Improving the Quality of Life through the Power in Light", Quantum Facts Series: QF1-01.

* cited by examiner

*Primary Examiner*—George Epps
*Assistant Examiner*—Tony Lu
(74) *Attorney, Agent, or Firm*—Mark J. Sprigings; Ogilvy Renault LLP

(57) ABSTRACT

A method and apparatus for protecting a photodiode of an optical receiver from overload optical signals by monitoring an operating parameter of the photodiode, determining if the operating parameter indicates that the photodiode is in a potential overload state in which the photodiode is susceptible to an overload optical signal; and applying a predetermined safe gain setting to the photodiode if a potential overload state is detected. The potential overload state may be a loss of signal condition, or detection of an overload optical power incident the photodiode.

7 Claims, 3 Drawing Sheets

METHOD AND APPARATUS FOR PROTECTING OPTICAL RECEIVERS FROM OVERLOAD OPTICAL SIGNALS

CROSS-REFERENCE TO RELATED APPLICATIONS

This is the first application filed for the present invention.

MICROFICHE APPENDIX

Not Applicable.

TECHNICAL FIELD

The invention relates in general to the field of telecommunications receiver control, and in particular to a method and apparatus for protecting optical receivers from overload optical signals.

BACKGROUND OF THE INVENTION

In the field of telecommunications, optical networking is a well established technology for transporting data at a high bit rate over long distances. The basic components of optical networks are an optical transmitter (such as a laser transmission system) for generating and modulating an optical signal, an optical waveguide (such as a fiber optic cable) for transporting the optical signal, and a photodetecter for receiving the modulated signal and converting the optical signal into an analogous electrical signal. While fiber-doped amplifiers well known in the art have been used to extend a distance over which the optical modulated signal can be conveyed, and numerous passive optical components have been developed to permit switching, and signal control within the optical domain, the requirement of converting the optical signal into an electrical format for digital computing, switching, regenerating, reformatting, etc., has remained an essential part of this technology.

Numerous different devices are known for generating analog electrical signals from optical signals. Semiconductor diodes that exhibit photoconductivity have been found to be particularly efficacious. Photoconductivity is a property of some diodes (photodiodes) that carry an electric current between an anode and a cathode, at a rate proportional to electromagnetic energy incident a depletion region disposed between the anode and cathode. Some (variable gain) photodiodes provide a means for variably magnifying a received optical signal to produce an analog electrical signal effectively multiplied by a scaling factor, or "gain". The gain of a variable gain photodiode is applied in relation to a physical parameter of the device to control a sensitivity of the photodiode to receive light.

Variable gain photodiodes are therefore very useful for receiving an optical signal that is attenuated in transit through the waveguide when the attenuation varies with one or more factors that are not directly controlled. For example, avalanche photodiodes (APDs) provide variable gain in dependence on a reverse voltage bias across the depletion region, and a consequent amount of impact ionization produced by the photons impinging on a crystalline lattice within the depletion region. Naturally it is important to control the gain of APDs in order to provide adaptive operating magnification of the analog electrical signal in response to an optical power of the received signal, a temperature of the photodiode, and any other relevant parameters. To this end U.S. Pat. No. 6,313,459, which issued on Nov. 6, 2001 to Hoffe et al., is informative and is incorporated herein by reference.

While APDs are of well recognized utility, an intrinsic limit on the current that can be transported across the depletion region poses problems because of an absence of any equivalent limitation on impact ionization. The charges produced by the electromagnetic energy incident on the crystalline lattice accelerated by the voltage bias are not regulated by anything more than the optical power, and the voltage bias, but if conduction across the photodiode is saturated, these charges have no path to ground, which may result in excessive heat, melting of affected regions, and damage to the photodiode. It is therefore necessary to prevent optical overloading of the photodiode with respect to the operating gain.

It is known in the art to control optical intensities of respective channels in wavelength division multiplexed (WDM) optical data transport systems using variable optical amplifiers. For example, a prior art optical data transport system shown in FIG. 1 schematically illustrates two network elements (NEs) 10a,b of such a data transport system. The NE 10a includes a transmitter 12 having a laser and modulation system 14 for launching a modulated optical signal. The transmitter 12 includes modulation control firmware 16 for driving the laser and modulation system 14, to impress the desired data onto a wavelength carrier to which the laser is tuned. A number of the optical wavelength carriers are produced in a like fashion, and a variable optical attenuator (VOA) 18 is applied to respective channels, in order to ensure substantially equal mean optical powers of each of the wavelength channels. This constant mean optical power is usually preferred because of an affect of doped-fiber amplifiers on imbalanced wavelength channels. The VOAs 18 are capable of independently attenuating the wavelength channels in response to downstream feedback, and may, in effect, reduce optical overload at downstream receivers.

The NE 10b includes a receiver 20 for receiving and demodulating the optical signal transmitted by the NE 10a. The receiver 20 includes a variable gain photodiode 22 that converts the optical signal into the analog electrical signal. Firmware of the receiver 20 is provisioned with program instructions to effect a negative feedback control loop 24 to control a sensitivity of the variable gain photodiode 22, in a manner that is somewhat analogous to automatic gain control circuits well known in the art, although automatic gain control is generally applied to a pre-amplifier receiving an analog electrical signal and so is entirely in the electrical domain. More precisely, the feedback control loop 24 reduces the sensitivity of the photodiode when a mean optical power of the received signal rises (over a predetermined interval), and increases the sensitivity if the mean optical power subsides.

While each NE typically includes at least one shelf of numerous receiver and transmitter cards, in the illustrated embodiment only one such transmitter 12 and receiver 20 is shown. For example, certain known NEs include a shelf having sixteen data receiver and transmission cards, a shelf card, and two switch control cards. Optical wavelength division multiplexing of a plurality of optical signals generated by numerous transmitters 12 may be performed by a multiplexer 26, and the multiplexed optical signal may be transmitted over an optical fiber waveguide 28. In such cases, a demultiplexer 30 is used to extract from the multiplexed optical signal, the wavelength carriers that are modulated to form the optical signal. The optical fiber waveguide 28 may span hundreds of kilometers and may include any number of optical components such as erbium doped fiber amplifiers well known in the art. In some embodiments, a sensor 32 taps off a predefined proportion of the multiplexed optical signal, and analyzes the power spectrum produced in order to compute a control signal used for controlling the independent wavelength channels at the VOA 18. In other embodiments the control signal is produced by the receiver 20 in response to a power, bit error rate, or quality of the received optical signal. The effect of the control of the VOA 18 may reduce an occurrence of overload optical power impinging on the photodiode 22, but it is an expensive solution, and does not permit the explicit identification of conditions that are likely to contribute to overload optical signals so that damaging optical signals can be reduced.

A Patent Abstract of Japan publication number 01157632 that names Murakami Taisuke as inventor, teaches a receiver having an optical attenuator that is controlled to reduce optical power of a modulated optical signal incident on a photodiode, in order to maximize a dynamic range of the photodiode. It will be appreciated by those skilled in the art that controllable variable optical attenuators are expensive, and that any attenuation of the optical signal constitutes a debit of a "link budget", because attenuation comes at a cost of a maximum distance between the laser and the receiver within which reception of the optical signal is consistently satisfactory.

There therefore remains a need for a method and apparatus for preventing damaging optical overload of a variable gain photodiode in an optical receiver.

SUMMARY OF THE INVENTION

It is therefore an object of the present invention to provide a method and apparatus for preventing damaging optical overload at a variable gain photodiode, and a photodetecter provisioned in accordance with the method and apparatus.

According to an aspect of the invention, a method for protecting a photodiode of an optical receiver from overload optical signals is provided. The method involves providing a feedback control loop for controlling a gain of the photodiode. The feedback control loop is adapted to monitor an operating parameter of the photodiode, compute an optimal gain setting in accordance with changes in the operating parameter, and apply the optimal gain setting to the photodiode. The monitoring of the operating parameter is used to detect a potential overload state in which the photodiode is susceptible to optical overload. In the event that a potential overload state is detected, the feedback control loop is controlled so that the feedback control loop is preempted, and a predetermined safe gain setting is applied to the photodiode.

The parameter may be optical power incident the photodiode, and an optical power incident the photodiode. The potential overload state may then be the optical power falling below a loss of signal threshold during which no optical data is received at the receiver. The potential overload state is preferably also associated with an optical power above an overload threshold.

In response to the loss of signal condition, the step of controlling the feedback control loop may involve applying a predetermined safe gain setting to the photodiode. If the optical power exceeds the overload threshold, the step of controlling the feedback control loop involves deactivating the photodiode, and preferably further involves raising an alarm.

In accordance with an aspect of the invention, an apparatus for protecting a variable gain photodiode of an optical receiver from overload optical signals is provided. The apparatus includes a feedback control circuit for controlling a gain of the photodiode in response to an operating parameter of the photodiode, a state detector for detecting if the operating parameter indicates that the photodiode is in a potential overload state in which the photodiode is susceptible to damaging overload, and for issuing an override command over the continuous feedback control circuit to apply a predetermined safe gain setting to the photodiode when the potential overload state is detected.

The photodiode may be an avalanche photodiode (APD), in which case the feedback control circuit may be a bias control circuit that modulates a reverse bias control circuit that modulates a reverse bias voltage across a depletion region of the APD.

A photodetecter for converting an optical signal into an electrical signal, is provided in accordance with another aspect of the invention. The photodetecter having a variable gain photodiode that converts the optical signal to an analog electrical signal, and outputs the electrical signal on a receiver circuit, is further equipped with a state detector for monitoring an operating parameter of the photodiode, determining if the operating parameter indicates a potential overload state in which the photodiode is susceptible to overload, and applying a predetermined safe gain setting to the photodiode, if the potential overload state is detected.

BRIEF DESCRIPTION OF THE DRAWINGS

Further features and advantages of the present invention will become apparent from the following detailed description, taken in combination with the appended drawings, in which.

It should be noted that throughout the appended drawings, like features are identified by like reference numerals.

DETAILED DESCRIPTION OF THE PREFERRED EMBODIMENT

The invention provides a control system for preventing damage to a variable gain photodiode caused by exposure to an optical power that exceeds to a sensitivity of the photodiode.

Figure 1:
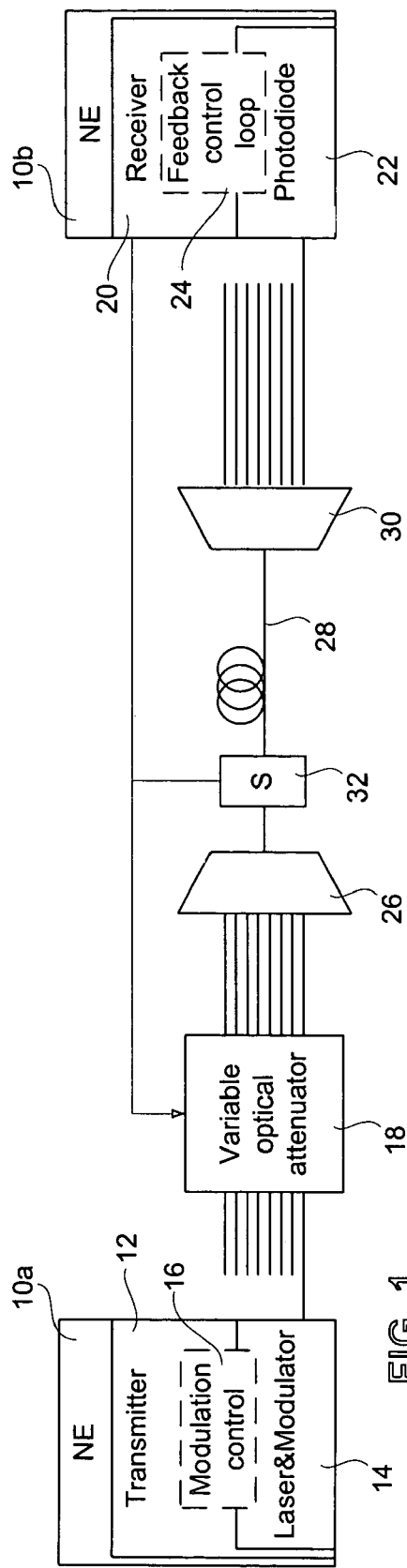
FIG. 1 is a block diagram schematically illustrating an optical data transport system of a known configuration.
Figure 2:
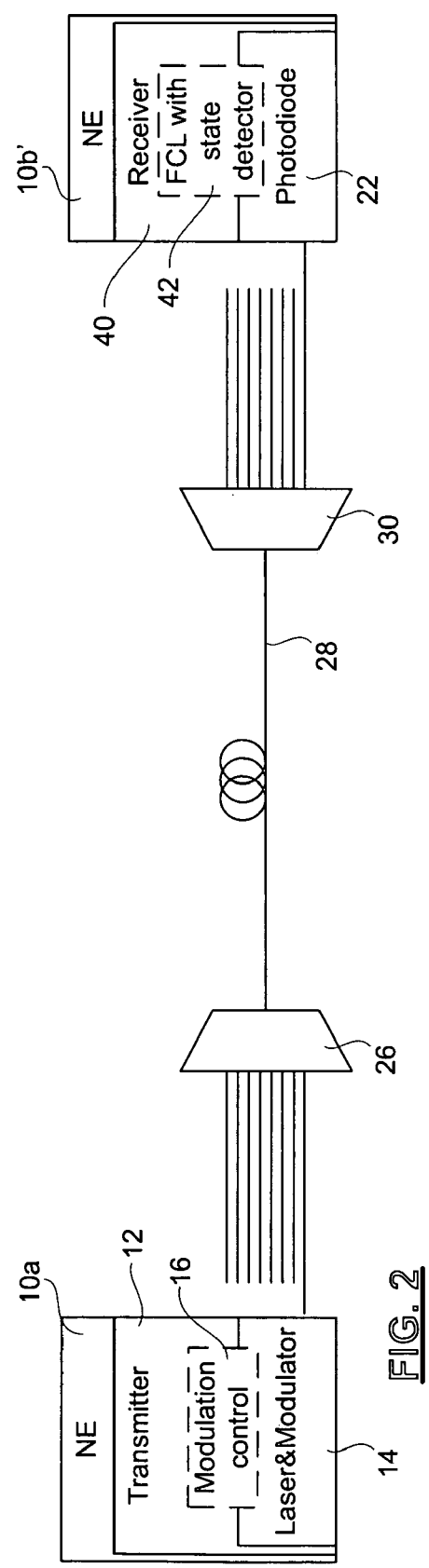
FIG. 2 is a block diagram schematically illustrating an optical data transport system in accordance with an embodiment of the invention.

FIG. 2 schematically illustrates an optical data transmission system in accordance with the present invention. Elements shown in FIG. 2 that are identical to corresponding elements shown in FIG. 1 are identified by like reference numerals and are not further described. It will be noted that the optical data transmission system shown in FIG. 2 does not include the VOA 18 shown in FIG. 1, but rather provides more efficient control over the exposure of the photodiode 22 of the NE 10*b*' to received optical signals using a modified receiver 40. The modified receiver 40 includes firmware for detecting when the photodiode is potentially susceptible to damaging overload, and accordingly overrides the feedback control loop (FCL) described above.

In accordance with the illustrated embodiment, two operating conditions of a variable gain photodiode 22 are monitored by the firmware: a loss of signal (LOS) condition; and an overload signal condition. During a LOS condition no modulated optical signal is received. During this time no optical signal is impinging on the photodiode, however this does not ensure that no light is incident the depletion region. Noise, cross-talk (a phenomenon whereby energy from one wavelength carrier is communicated to another wavelength carrier), imperfections in the demultiplexer 30, and other effects may cause light to be incident on the receiver 40. Because this light is of a low power compared to the optical signal, the feedback control loop increases sensitivity throughout the LOS condition. Further, as the light impinging on the photodiode throughout the LOS condition includes a substantial, inherently erratic, noise component, the photodiode is exposed to a greater risk of overload in this state. In addition, when a LOS condition clears and the optical signal resumes, the increased gain setting is no longer appropriate, and requires a return to a (usually intermediate) gain setting. Further still, if as a result of a cable misconnection the receiver is connected to a lit fiber, the sudden change in incident optical power can damage the photodiode. As there is no advantage to applying an increased gain setting during a LOS condition (when only noise is detected), and the photodiode 22 becomes susceptible to damage during the LOS condition, the state detector is adapted to override the feedback control loop to ensure that a predetermined low sensitivity gain setting is applied at the photodiode 22.

A second signal condition that is monitored by the state monitor component of the firmware, in the receiver 40 is the overload signal condition. If the state monitor determines that the optical power is higher than a predefined overload threshold, the state monitor issues an alarm to a network management system, and effectively deactivates the photodiode, the feedback control loop and the entire receiver 40.

Figure 3:
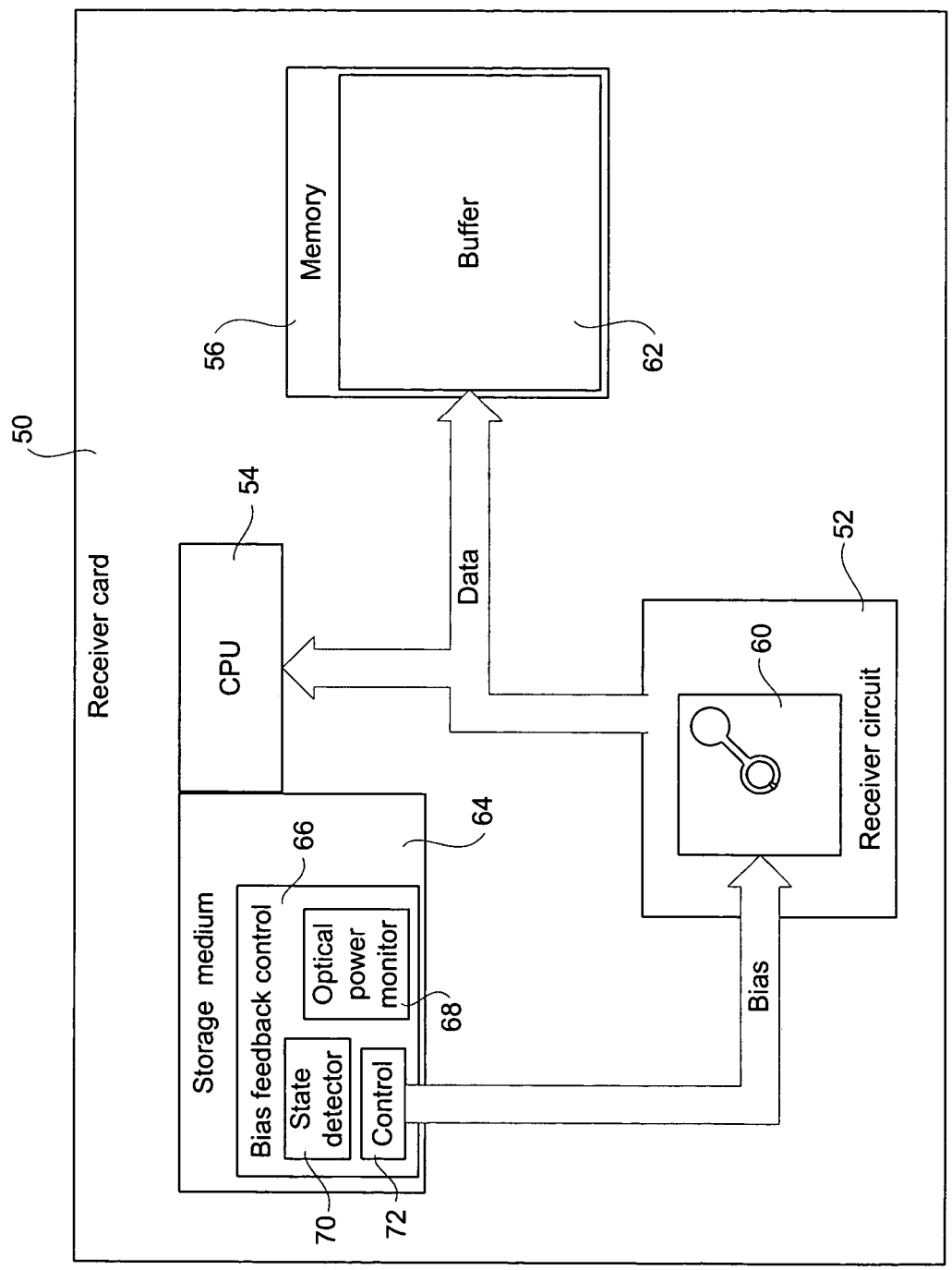
FIG. 3 is a block diagram schematically illustrating selected parts of an optical receiver in accordance with an embodiment of the invention.

While in the embodiment illustrated in FIG. 3, the variable gain photodiode 22 is an avalanche photodiode (APD) it should be understood that other devices that detect and variably magnify an optical signal, including devices that are not available today, could also be used to achieve the objects of the invention. As is common in the application of APDs, the variable magnification is controlled by the reverse bias voltage applied across the depletion region. In accordance with the invention, the reverse bias voltage is calibrated with respect to a gain scale (M=1 . . . 20), although as is described in the above-referenced United States Patent to Hoffe, the operating range of the bias voltage may be restricted to a range not below 2–3, and not above 10, because of favorable characteristics in this domain (e.g. low noise and linearity) and further that the scale is a function of temperature.

Furthermore while the embodiment shown in FIG. 3 illustrates the invention integrated with a known feedback control loop, and there are advantages in reusing the optical power monitoring and bias control circuits of the prior art to effect the invention, it should be understood that the invention may be implemented independently of the feedback control loop. Accordingly the objects of the invention can be achieved using a variable gain photodiode, and a state detector that is adapted to monitor an operating parameter (such as optical power) received by the photodiode, determine if the operating parameter indicates that the photodiode is in a potential overload state, and apply a safe gain setting to the photodiode if the potential overload state is detected.

FIG. 3 schematically illustrates selected components of an embodiment of a receiver card 50 in accordance with the invention. The receiver card 50 includes a receiver circuit 52, central processing unit (CPU) 54, and memory 56 interconnected in one of the ways well known in the art. The receiver circuit 52 includes an avalanche photodiode (APD) 60, which outputs an analog electrical signal in dependence on an intensity of light incident the depletion region, and a voltage bias across the depletion region. The output of the APD 60 is modified by elements of the receiver circuit 52, which may include one or more electrical amplifiers (including a preamplifier, which may be a transimpedance amplifier) along with clock and data recovery circuit components, and protocol-based frame reception equipment, etc., all of which are well known in the art. The receiver circuit 50 outputs received data to a buffer 62 of the memory and transmits such portions the data to the CPU 54 as required.

The CPU 54 is a processor adapted to execute program instructions stored in a storage medium 64, which includes instructions for interacting with hardware components, such as some of the hardware components of the receiver circuit 52. Specifically the storage medium 64 includes programmed instructions for implementing a bias feedback control 66, which is a part of an exemplary feedback control loop in accordance with an embodiment of the invention. The bias feedback control 66 includes an optical power monitor 68, which is adapted to measure an optical power incident the depletion region of the APD 60. For example, the optical power monitor 68 may monitor precise reverse bias voltage settings, and an amplitude of the resulting electrical signal in order to compute the optical power incident the APD 60. As will be appreciated by those skilled in the art, the reverse bias voltage of the APD 60 is updated at a predetermined frequency. If the APD 60 is not maintained at a predefined operating termperature, the bias feedback control 66 may further include a temperature sensor and a temperature compensation program for computing, for each period of the predetermined frequency, a change in a bias gain scale. This much of the bias feedback control 66 corresponds with the teachings of Hoffe et al.

In accordance with the present invention, the output of the optical power monitor 68 is further examined by program instructions that instantiate a state detector 70. The state detector 70 identifies optical power values that indicate a potential overload state, such as the LOS condition and the overload condition explained above. Two simple first order filters can be used to identify the LOS and overload conditions. Other operating conditions associated with overload can be detected with other filters and can be designed in a manner well known in the art.

A control process 72 of the bias feedback control 66 applies a computed optimal bias voltage to the APD 60, unless the state detector indicates that the APD 60 has lapsed into one of the two potential overload states. If the APD 60 falls into the LOS condition, the control defaults the bias voltage to a low sensitivity gain setting, which in the case of an APD, is a predetermined low bias voltage. The low sensitivity bias setting may be a manufacturer suggested setting and may be factory set, (or a factory set bias voltage as a function of temperature may be used in non-temperature controlled applications). For example, the minimum sensitivity of the range (M=3) may. be applied to the APD 60 throughout the LOS condition. If an optical overload condition is detected by the state detector 70, the control 72 effects a shutdown sequence that involves raising network management alarms, and eliminating the reverse bias voltage across the depletion region.

Figure 4:
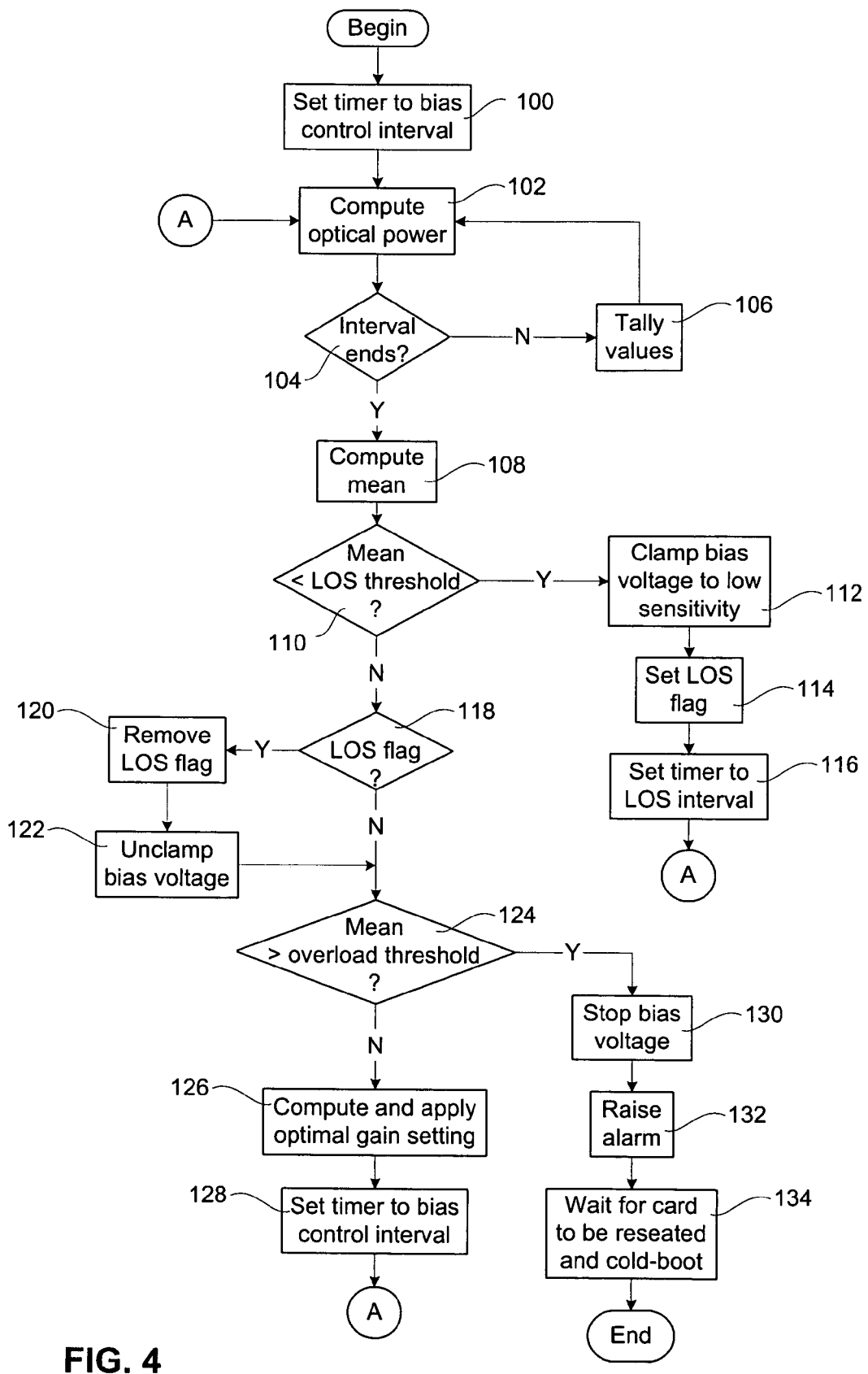
FIG. 4 is a flow chart illustrating principal steps involved in a process in accordance with an embodiment of the invention.

FIG. 4 is a flow chart illustrating principal steps involved in an exemplary process in accordance with the invention for preventing optical overload of an APD, which incorporates a negative feedback control loop known in the art. The process shown in FIG. 4 begins when the receiver circuit (such as that shown in FIG. 3) begins performing optical to electrical signal conversion at the APD, and amplification and sampling of the analog signal to output a clock synchronous digital signal, in a manner well known in the art. In step 100, a timer is set to a bias voltage control interval of a predetermined duration. While the trade-offs between hardware limitations and costs, and desired limitations on the rate at which the bias voltage is adjusted are well known, and various optical data transmission systems may use other bias voltage adjustment rates, some optical transmission systems use a bias control interval of about one tenth of a second. As a bi-product of the receiver, feedback from the received electrical signal is produced. The feedback may be in the form of a mean, or a peak amplitude of the electrical signal (or respective moduli, or squares thereof), for example. The feedback and the current setting of the voltage bias are used to compute the optical power of light incident the APD (step 102).

The periodic computation of optical power using the feedback continues until it is determined (step 104) that the interval timer has elapsed. That is, the optical power values are tallied (step 106) or otherwise stored, and the process returns to step 102. When the interval ends, tallied optical power of the interval is used to compute a mean optical power (step 108).

In step 110 it is determined whether the mean optical power is below a loss of signal (LOS) threshold. If the mean optical power is determined to be below the LOS threshold, the bias voltage is clamped to a predetermined low sensitivity bias voltage (step 112). As explained above, the low sensitivity bias voltage may be factory assigned, and may be at a gain factor of 3. After the bias voltage is clamped, a LOS flag is set to indicate the state of the bias control (step 114) and, in step 116 the timer is set for a LOS interval before the process returns to step 102. The LOS interval may be significantly shorter than the bias control interval (e.g. 5 milliseconds) so that a minimum of data is lost when the signal is reestablished recommences after the LOS condition ends.

If in step 110 it is determined that the mean optical power is not below the LOS threshold, it is determined (step 118) whether the LOS flag is set. If the LOS flag is set, the bias voltage is clamped but the optical power indicates that a signal is now being received at the APD, and accordingly the LOS flag is removed (step 120), and the bias voltage is unclamped (step 122). In either case the process advances to step 124 where it is determined whether the mean optical power is greater than an overload threshold. If the mean optical power is less than (or equal to) the overload threshold, the mean optical power is used to compute an optimal bias voltage for the APD (or more generally a gain setting for a broader class of photodiodes). The computed optimal bias voltage is applied (step 126) to the APD via a bias control circuit, the timer is set to the bias control interval (step 128), and the process returns to step 102.

Otherwise the mean optical power is determined to be greater than the overload threshold. While the negative feedback control loop will naturally reduce the bias voltage to a predefined minimum voltage as the optical power increases, there are conditions under which, at this minimum voltage, an incident signal may overload the APD. For example, if an optical fiber is incorrectly coupled from a transmitter to a receiver of a same NE, the optical power will not be adequately attenuated, and may be received at a power that is greater than −2 dBm of the launched optical power, which constitutes an overload optical signal. Furthermore given changes in configurations of networks and interconnections of NEs, it is possible that a signal coming from a remote NE could be amplified excessively resulting in an overload signal. All of these potential problems are addressed by the above-described overload threshold. When an overload condition is detected, the bias voltage is shut off (step 130) and the receiver circuit is deactivated. The CPU raises an alarm (step 132) that can, for example, only be cleared by reseating the receiver card in the shelf. Accordingly the receiver is off-line until it is reinitialized by a cold boot, in a manner well known in the art (step 134).

The invention has thus been described in relation to a method and apparatus for protecting a variable gain photodiode of an optical receiver from overload optical signals. The method and apparatus may augment a known feedback control loop, in the event that the variable gain photodiode enters a state wherein it is potentially susceptible to overload optical power. By protecting it from the effects of overload optical power, the useful life of the variable gain photodiode can be extended.

The embodiments of the invention described above are intended to be exemplary only. The scope of the invention is therefore intended to be limited solely by the scope of the appended claims.

I claim:

1. A method for protecting an avalanche photodiode (APD) of an optical receiver from overload optical signals, comprising:

providing a feedback control loop for controlling a gain of the photodiode by measuring an optical power incident the photodiode, and computing and applying an optimal gain setting in accordance with changes in the measured optical power;

using the measured optical power to detect a potential overload state in which the photodiode is susceptible to optical overload;

controlling the feedback control loop so that if the potential overload state is detected, the feedback control loop is preempted and a predetermined safe gain setting is applied to the photodiode by a bias control circuit that modulates a reverse bias voltage across a depletion region of the APD; and determining that the measured optical power indicates that the photodiode is susceptible to overload when the measured optical power falls below a threshold that is associated with a loss of signal condition during which no signal is received at the photodiode.

2. The method as claimed in claim 1 wherein overriding the feedback control loop to apply the predetermined safe gain setting to the APD comprises setting the reverse bias voltage to a predefined low sensitivity gain setting throughout the loss of signal condition.

3. An apparatus for protecting a variable gain avalanche photodiode(APD) of an optical receiver from overload optical signals, the apparatus comprising:

a feedback control circuit comprising a bias control circuit that modulates a reverse bias voltage across a depletion region of the photodiode for controlling a gain of the photodiode in response to an operating parameter of the photodiode;

a state detector comprising an optical power monitor that computes an optical power incident the photodiode for detecting if the operating parameter indicates that the photodiode is in a potential overload state in which the photodiode is susceptible to overload, and for issuing an override command over the feedback control circuit to apply a predetermined safe gain setting to the photodiode when the potential overload state is detected; and wherein the state detector computes a mean optical power incident the photodiode, and determines that the photodiode is in a potential overload state if the computed optical power falls below a loss of signal(LOS) threshold that is associated with a loss of signal condition during which no optical signal is received.

4. The apparatus as claimed in claim 3 wherein the state detector also issues a command to the photodiode to fix a sensitivity of the photodiode to the predetermined safe gain setting in the event that the state detector determines that the measured optical power falls below the LOS threshold.

5. The apparatus as claimed in claim 3 wherein the state detector determines that the measured optical power indicates that the photodiode is susceptible to overload when the computed optical power is above an overload threshold that is associated with an overload condition.

6. The apparatus as claimed in claim 5 wherein the state detector issues a command to the photodiode to deactivate the photodiode when the computed optical power is above the overload threshold.

7. The apparatus as claimed in claim 6 wherein the state detector raises an alarm that must be cleared by network management after deactivating the photodiode.

* * * * *